(12) United States Patent
Akram et al.

(10) Patent No.: US 6,229,324 B1
(45) Date of Patent: *May 8, 2001

(54) TEST SYSTEM WITH MECHANICAL ALIGNMENT FOR SEMICONDUCTOR CHIP SCALE PACKAGES AND DICE

(75) Inventors: Salman Akram, Boise; Warren M. Farnworth, Nampa; David R. Hembree, Boise, all of ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/365,461

(22) Filed: Aug. 2, 1999

Related U.S. Application Data

(62) Division of application No. 08/988,433, filed on Dec. 11, 1997, now Pat. No. 6,018,249.

(51) Int. Cl.$^7$ .................................................. G01R 31/02
(52) U.S. Cl. ........................... 324/758; 324/765; 324/755
(58) Field of Search ..................................... 324/755, 754, 324/761, 762, 765, 758; 438/14, 17–18; 251/40, 48

(56) References Cited

U.S. PATENT DOCUMENTS

| | | |
|---|---|---|
| 5,006,792 | 4/1991 | Malhi et al. . |
| 5,046,239 | 9/1991 | Miller et al. . |
| 5,088,190 | 2/1992 | Malhi et al. . |
| 5,172,050 | 12/1992 | Swapp . |
| 5,196,726 | 3/1993 | Nishiguichi et al. . |
| 5,329,423 | 7/1994 | Scholz . |
| 5,341,564 | 8/1994 | Akhavain et al. . |
| 5,483,174 | 1/1996 | Hembree et al. . |
| 5,495,179 | 2/1996 | Wood et al. . |
| 5,500,605 | 3/1996 | Chang . |
| 5,519,332 | 5/1996 | Wood et al. . |
| 5,530,376 | 6/1996 | Lim et al. . |
| 5,541,525 | 7/1996 | Wood et al. . |
| 5,543,725 | 8/1996 | Lim et al. . |
| 5,559,444 | 9/1996 | Farnworth et al. . |
| 5,572,140 | 11/1996 | Lim et al. . |
| 5,574,383 | 11/1996 | Saito et al. . |
| 5,578,934 | 11/1996 | Wood et al. . |
| 5,592,736 | 1/1997 | Akram et al. . |

(List continued on next page.)

OTHER PUBLICATIONS

Lorenz, H. et al., "Suss report", brochure, vol. 10, Third/Fourth Quarter, 1996.

*Primary Examiner*—Vinh P. Nguyen
(74) *Attorney, Agent, or Firm*—Stephen A. Gratton

(57) ABSTRACT

A test system for testing semiconductor components, such as bumped dice and chip scale packages, is provided. The test system includes a base for retaining one or more components, and an interconnect for making temporary electrical connections with the components. The test system also includes an alignment fixture having an alignment surface for aligning the components to the interconnect. In addition, the components can include alignment members, such as beveled edges, bumps, or posts configured to interact with the alignment surface. The alignment fixture can be formed as a polymer layer, such as a layer of resist, which is deposited, developed and then cured using a wafer level fabrication process. The alignment surface can be an opening in the polymer layer configured to engage edges of the components, or alternately to engage the alignment members.

15 Claims, 4 Drawing Sheets

U.S. PATENT DOCUMENTS

| | | |
|---|---|---|
| 5,625,298 | 4/1997 | Hirano et al. . |
| 5,633,122 | 5/1997 | Tuttle . |
| 5,634,267 | 6/1997 | Farnworth et al. . |
| 5,691,649 | 11/1997 | Farnworth et al. . |
| 5,703,493 | 12/1997 | Weeks et al. . |
| 5,756,370 | 5/1998 | Farnworth et al. . |
| 5,834,945 | 11/1998 | Akram et al. . |
| 5,915,977 | 6/1999 | Hembree et al. . |
| 5,931,685 | 8/1999 | Hembree et al. . |
| 5,962,921 | 10/1999 | Farnworth et al. . |
| 6,005,288 | 12/1999 | Farnworth et al. . |
| 6,016,060 | 1/2000 | Akram et al. . |
| 6,018,249 * | 1/2000 | Akram et al. ........................ 324/758 |
| 6,040,702 | 3/2000 | Hembree et al. . |
| 6,072,326 | 6/2000 | Akram et al. . |
| 6,077,723 | 6/2000 | Farnworth et al. . |
| 6,091,252 | 7/2000 | Akram et al. . |

\* cited by examiner

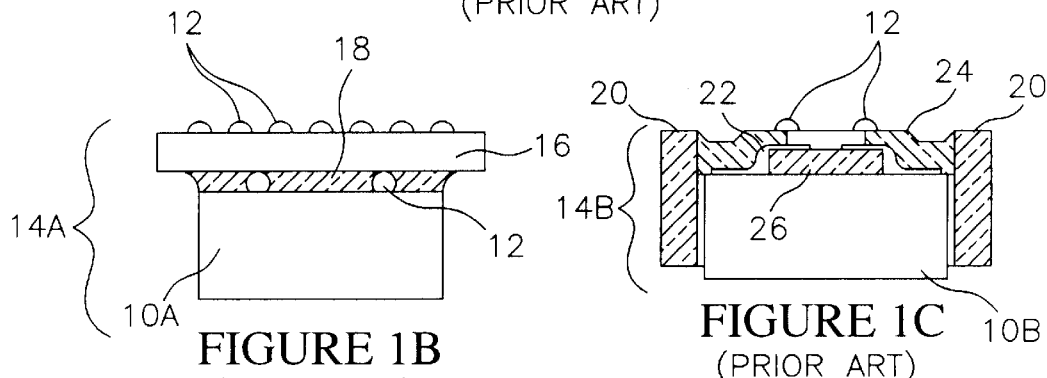
FIGURE 1A (PRIOR ART)
FIGURE 1B (PRIOR ART)
FIGURE 1C (PRIOR ART)
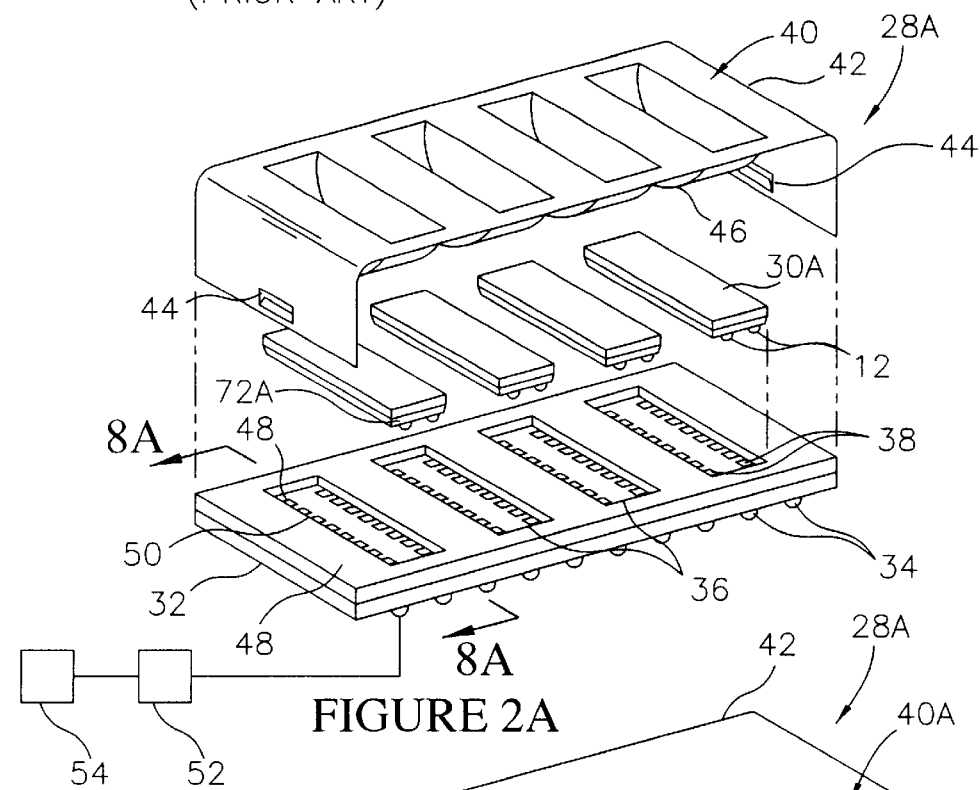
FIGURE 2A
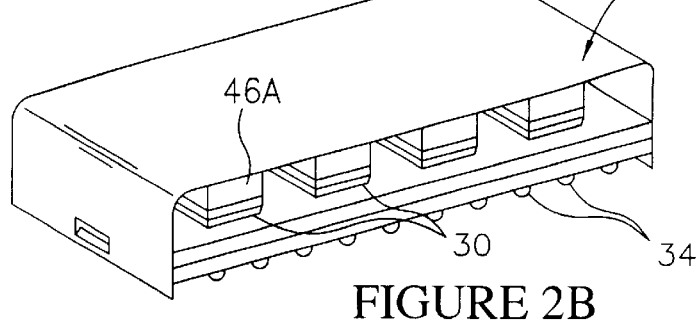
FIGURE 2B

US 6,229,324 B1

TEST SYSTEM WITH MECHANICAL ALIGNMENT FOR SEMICONDUCTOR CHIP SCALE PACKAGES AND DICE

CROSS REFERENCE TO RELATED APPLICATIONS

This application is a division of patent application Ser. No. 08/988,433 filed Dec. 11, 1997, now U.S. Pat. No. 6,018,249.

FIELD OF THE INVENTION

This invention relates generally to testing of semiconductor components, such as chip scale packages and are dice. More particularly, this invention relates to a test system with mechanical alignment and to a method for fabricating the test system.

BACKGROUND OF THE INVENTION

A recently developed semiconductor package is known as a "chip scale package" or a "chip size package". The dice contained in these packages are referred to as being "minimally packaged". Chip scale packages can be constructed in "cased" or "uncased" configurations. Cased chip scale packages have a peripheral outline that is slightly larger that an unpackaged die. Uncased chip scale packages have a peripheral outline that is about the same as an unpackaged die.

Typically, a cased chip scale package includes a substrate formed of plastic, ceramic, or other electrically insulating material bonded to the face of the die. The substrate can include external contacts for making outside electrical connections to the chip scale package. For example, the external contacts for a chip scale package can comprise contact bumps arranged in a ball grid array (BGA), or a fine ball grid array (FBGA). Typically, the external contacts comprise a solder material, that permits the chip scale package to be flip chip bonded to a printed circuit board, or other substrate. Uncased chip scale packages can include external contacts formed directly on the device bond pads in the manner of a bumped die.

Following the manufacturing process, chip scale packages must be tested and burned-in. Test apparatus can be used to house one or more chip scale packages for testing, and to make temporary electrical connections with the external contacts on the chip scale packages. The test apparatus can include an interconnect component having contact members adapted to make the temporary electrical connections with the external contacts on the chip scale packages.

For making the electrical connections the contact members on the interconnect must be aligned with the external contacts on the chip scale packages. One method of alignment is with an optical alignment system such as described in U.S. Pat. No. 5,634,267 to Wood et al. Another method of alignment is with a mechanical alignment system.

The present invention is directed to a test system with an improved mechanical alignment system. The test system can be used to test chip scale packages or other semiconductor components such as bare semiconductor dice.

SUMMARY OF THE INVENTION

In accordance with the present invention, a test system for semiconductor components, and a method for fabricating the test system are provided. The components can be chip scale packages, or bare semiconductor dice, having external contacts in the form of contact bumps.

The test system includes a base for retaining one or more components, and multiple interconnects having contact members for making temporary electrical connections with the external contacts on the components. The test system also includes a mechanical alignment fixture having alignment surfaces for aligning the components to the interconnects. A single alignment fixture can be formed on the base, or separate alignment fixtures can be formed on each interconnect. In addition to the alignment fixture, the components can include alignment members configured to interact with the alignment surfaces on the alignment fixture and guide the components into alignment with the interconnects. Illustrative alignment members include beveled edges, alignment bumps, and alignment posts formed on the components.

Several different embodiments of alignment fixtures are disclosed. In each embodiment the alignment fixtures include alignment surfaces of a desired configuration. For example, the alignment surfaces can include openings in the alignment fixtures sized to engage the alignment members on the components. The alignment surfaces can also be configured for engaging the edges of the components, or for engaging the contact bumps on the components. Still further, the alignment surfaces can be configured for a two stage alignment procedure including a coarse alignment stage and a fine alignment stage. In the two stage embodiment, a first layer of the alignment fixture can provide a first surface for coarse alignment, while a second layer of the alignment fixture can provide a second surface for fine alignment.

The alignment fixture can comprise a polymeric material, such as a thick film resist, which is deposited on the interconnects, developed with alignment surfaces, and then cured. Preferably, the thick film resist is deposited on a wafer that includes multiple interconnects, which are singulated following development and curing of the resist. Alternately, the alignment fixture can comprise a polymer tape applied to the interconnects in a desired pattern. As another alternative, the alignment fixture can comprise a separate plate attached to the interconnects, or to the base of the system.

BRIEF DESCRIPTION OF THE DRAWINGS

FIG. 1A is a schematic side elevation view of a prior art component in the form of a bumped semiconductor die;

FIG. 1B and 1C are schematic cross sectional views of prior art components in the form of chip scale packages;

FIG. 2A is a schematic perspective view of a test system constructed in accordance with the invention and illustrated in an unassembled configuration;

FIG. 2B is a schematic perspective view of an alternate embodiment test system illustrated in an assembled configuration;

DETAILED DESCRIPTION OF THE PREFERRED EMBODIMENTS

Figure 3:
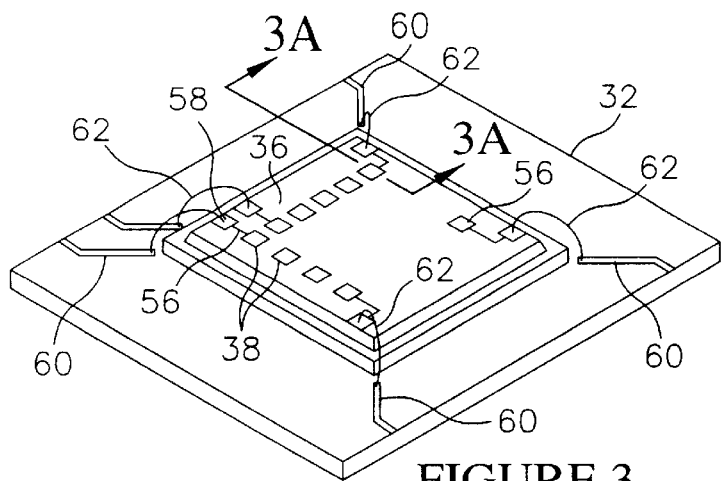
FIG. 3 is a schematic perspective view of an interconnect component for the test system of FIG. 2A or 2B.

Referring to FIG. 1A–1C, prior art semiconductor components are illustrated. In FIG. 1A, a bumped semiconductor die 10 includes a pattern of contact bumps 12. Typically the contact bumps 12 are arranged in a dense array. By way of example, the contact bumps 12 can be arranged in a ball grid array (BGA), or a fine ball grid array (FBGA). The contact bumps 12 are in electrical communication with various semiconductor devices and integrated circuits formed on the die 10.

The contact bumps 12 can be formed by processes that are known in the art, such as electro-deposition, and ball limiting metallurgy (BLM). Typically, the contact bumps 12 comprise a solder alloy. Representative solder alloys for the contact bumps 12 include 95%Pb/5%Sn, 60%Pb/40%Sn, 63%In/37%Sn, 100%Sn, and 62%Pb/36%Sn/2%Ag. Each contact bump 12 can be generally hemispherical, convex, or dome-shaped, with an outside diameter "D" and a height of "H".

Representative size ranges for the diameter "D" and height "H" can be from about 2.5 mils to 30 mils.

Referring to FIG. 1B, a die 10A can also be contained within a chip scale package 14A. The chip scale package 14A comprises a BGA substrate 16 bonded to the face of the die 10A with an adhesive layer 18. The BGA substrate 16 includes contact bumps 12 in electrical communication with the contact bumps 12 on the die 10A. The contact bumps 12 on the BGA substrate 16 are substantially equivalent to the contact bumps 12 (FIG. 1A) previously described.

Referring to FIG. 1C, a chip scale package 14B comprises a semiconductor die 10B, and protective members 20 bonded to either side of the die 10B. In addition, the chip scale package 14B includes contact bumps 12 in electrical communication with the die bond pads via leads 22. An encapsulant 24 and an elastomeric pad 26 electrically isolate the leads 22 and the contact bumps 12. As is apparent, these configurations are merely exemplary and other chip scale package configurations are known in the art.

Referring to FIG. 2A, a test system 28 constructed in accordance with the invention is illustrated. The test system 28 is configured to test multiple semiconductor components 30A. The test system 28 includes a base 32 configured to retain the components 30A. The base 32 includes external contacts 34 configured for mating electrical engagement with a test apparatus 52, such as a burn-in board. The test apparatus 52 is in electrical communication with test circuitry 54. The test circuitry 54 is configured to apply test signals to the integrated circuits contained on the components 30A and to analyze the resultant signals.

The test system 28 also includes multiple interconnects 36 mounted to the base 32. The interconnects 36 include patterns of contact members 38 configured to form non-bonded, temporary electrical connections, with the contact bumps 12 on the components 30A. In addition, the test system 28 includes a force applying mechanism 40 configured to bias the components 30A against the interconnects 36. In the illustrative embodiment, the force applying mechanism comprises a bridge clamp 42 having clip portions 44 attachable to the base 32, and leaf springs 46 attached to the bridge clamp 42.

The test system 28 also includes a mechanical alignment fixture 48 configured to align the components 30A to the interconnects 36. In the illustrative embodiment, the alignment fixture 48 comprises a polymer fence formed on the base 32 and interconnects 36. The alignment fixture 48 includes alignment surfaces in the form of alignment openings 50. Each alignment opening 50 can be sized and shaped to contact alignment members 72A on the components 30A to be hereinafter described. Alternately, the alignment openings 50 can be configured to contact outside edges of the components 30A, or to contact the contact bumps 12 on the components 30A.

Referring to FIG. 2B, an alternate embodiment test system 28A includes a force applying mechanism 40A with elastomeric spring members 46A. The elastomeric spring members 46A can be formed of a material such as silicone, butyl rubber, or fluorosilicone. Suitable elastomeric materials include "PORON" available from Rogers. The elastomeric spring members 46A can be secured to the bridge clamp 42 using an adhesive such as silicone. One suitable adhesive is "ZYMET" silicone elastomer manufactured by Zymet, Inc., East Hanover, N.J. Rather than being formed of elastomeric materials, the spring members 46A can be formed as compressible gas filled bladders. This type of bladder is available from Paratech of Frankfort, Ill. under the trademark "MAXI FORCE AIR BAG".

Referring to FIG. 3, the mounting of an individual interconnect 36 to the base 32 is illustrated. In FIG. 3, the alignment fixture 48 is not shown for illustrative purposes. The interconnect 36 includes the contact members 38 in patterns matching the patterns of the contact bumps 12 on the components 30A. In addition, the interconnect 36 includes patterns of conductors 56, and bonding pads 58, in electrical communication with the contact members 38. The bonding pads 58 can be formed on recessed surfaces 37 located along opposite edges of the interconnect 36. The base 32 also includes patterns of conductors 60 in electrical communication with the external contacts 34 on the base 32. Bond wires 62 can be bonded to the bonding pads 58 on the interconnect 36, and to the conductors 60 on the base 32 to establish electrical communication therebetween. The recessed surfaces 37 of the interconnect 36 allow the bond wires 62 to be attached with a minimum of interference with other system components. Electrical paths between the interconnect 36 and base 32 can also be formed by flex circuit (not shown) or mechanical electrical connectors such as clips or pins (not shown).

Figure 3A:
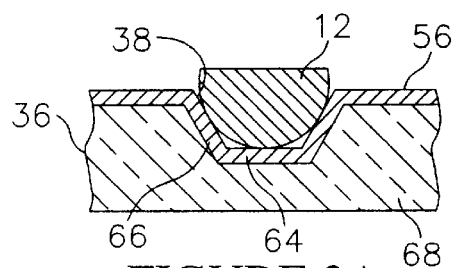
FIG. 3A is an enlarged cross sectional view taken along section line 3A—3A of FIG. 3 illustrating a contact member of the interconnect.

Referring to FIG. 3A, an individual contact member 38 is illustrated in greater detail. In the illustrative embodiment, each contact member 38 comprises an indentation 64 formed in a substrate 68 of the interconnect 36. Each indentation 64 is covered with a conductive layer 66 in electrical communication with a corresponding conductor 56 formed on a surface of the substrate 68. Each indentation 64 is sized to retain and electrically contact an individual contact bump 12. In addition, each indentation 64 can include sloped sidewalls for guiding and aligning the contact bumps 12.

The substrate 68 of the interconnect 36 can comprise ceramic, plastic, polyimide, FR-4, photo-machineable glass, or a semiconducting material, such as silicon. The indentations 64 for the contact members 38 can be formed by etching or machining the substrate 68. The conductive layer 66 and conductors 56 can be formed within the indentations 64, and on the surface of the substrate 68 out of highly conductive metals, such as aluminum, copper and tungsten, using a suitable metallization process (deposition, patterning, etching).

Figure 4A:
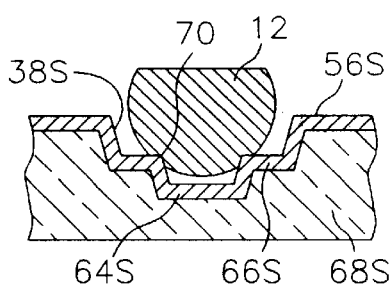
FIGS. 4A and 4B are enlarged cross sectional views of an alternate embodiment contact member.
Figure 4B:
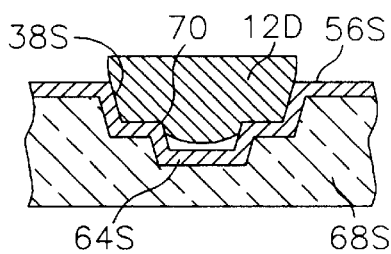

Referring to FIG. 4A, an alternate embodiment contact member 38S includes a stepped indentation 64S. The stepped indentation 64S can have a stepped-pyramidal, or inverted "ziggurat" shape, comprising an upper cavity with sloped walls, and a smaller lower cavity with sloped walls. Again the indentation 64S is covered by a conductive layer 66S in electrical communication with a corresponding conductor 56S. In this embodiment, the conductive layer 66S includes edges 70. The indentation 64S can be sized such that the edges 70 penetrate any oxide layers and electrically engage the contact bumps 12. As shown in FIG. 4B, because of size variations in the contact bumps 12 and large biasing forces, some contact bumps 12 may press into the lower cavity of the indentation 64S to form a deformed contact bump 12D. In this case the upper cavity of the indentation 64S limits further deformation of the contact bump 12.

Other types of contact members configured to make non-bonded, temporary electrical connections with contact bumps 12 are described in the following U.S. Patent Applications, which are incorporated herein by reference:

U.S. patent application Ser. No. 08/829,193, now U.S. Pat. No. 5,962,921, entitled "Interconnect Having Recessed Contact Members With Penetrating Blades For Testing Semiconductor Dice And Packages With Contact Bumps";

U.S. patent application Ser. No. 08/823,490, now U.S. Pat. No. 6,016,060, entitled "Method, Apparatus And System For Testing Bumped Semiconductor Components"; and U.S. patent application Ser. No. 08/867,551, now U.S. Pat. No. 5,931,625, entitled "Interconnect For Making Temporary Electrical Connections With Bumped Semiconductor Components.

Figure 5:
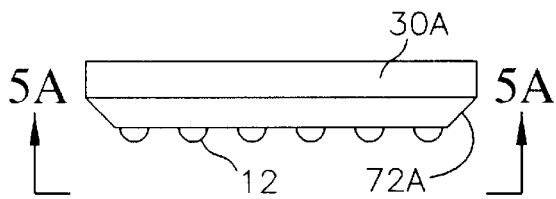
FIG. 5 is a schematic side elevation view of a semiconductor component having alignment members in the form of beveled edges.
Figure 5A:
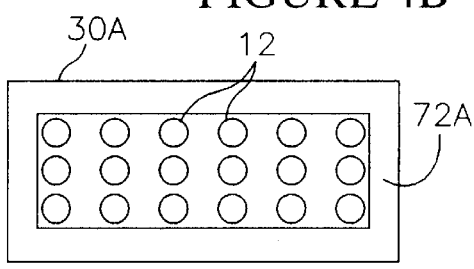
FIG. 5A is a bottom view taken along section line 5A—5A of FIG. 5.

Referring to FIGS. 5 and 5A, a semiconductor component 30A configured for use with the test system 28 (FIG. 2A) is illustrated. The semiconductor component 30A comprises a semiconductor die (e.g., 10-FIG. 1A) or a chip scale package (e.g., 14A-FIG. 1B, 14B-FIG. 1C) with contact bumps 12 formed substantially as previously described. In addition, the component 30A includes an alignment member comprising a beveled edge 72A formed on the outer periphery of the component 30A along the face (circuit side) and edges thereof. As will be further explained, the beveled edge 72A can be configured to contact alignment surfaces on the alignment opening 50 (FIG. 2A) of the alignment fixture 48 (FIG. 2A), to guide and align the component 30A with respect to the interconnect 36 (FIG. 2A).

An angle of the beveled edge 72A can be selected as required (e.g., 30°, 45°, 60°). In addition, the beveled edge 72 can be formed through a portion of a thickness of the component 30A as shown, or through a full thickness of the component 30A. One method for forming the beveled edge 72A comprises fabricating the component 30A on a wafer (not shown), and then sawing the wafer using a beveled saw blade. For example, the beveled edge 72A can be formed during a first saw cut with a beveled saw blade. During a second saw cut, a straight edged saw blade can be used to singulate the component 30A from the wafer. Suitable saw blades with beveled edges are available from "DISCO" of Disco Hi-Tec America, Inc. Santa Clara, Calif.

Figure 6:
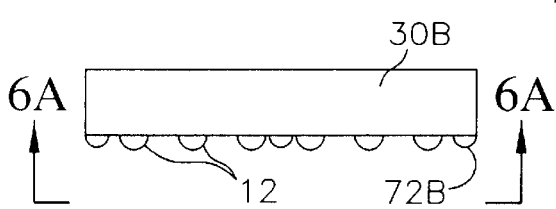
FIG. 6 is a schematic side elevation view of a semiconductor component having alignment members in the form of alignment bumps.
Figure 6A:
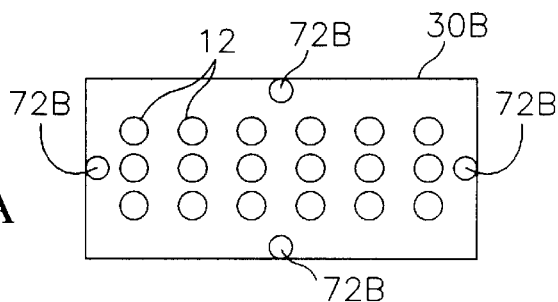
FIG. 6A is a bottom view taken along section line 6A—6A of FIG. 6.

Referring to FIGS. 6 and 6A, another semiconductor component 30B configured for use with the test system 28 is shown. The component 30B comprises a semiconductor die (e.g., die 10-FIG. 1A) or a chip scale package (e.g., 14A-FIG. 1B, 14B-FIG. 1C) with contact bumps 12. In addition, the component 30B includes alignment members in the form of alignment bumps 72B. The alignment bumps 72B comprise polymer or metal bumps similar in size and shape to the contact bumps 12. The alignment bumps 72B are formed in a pattern along the peripheral edges of the component 30B. In the illustrative embodiment there are four alignment bumps 72B, located midway along the lateral and longitudinal edges of the component 30B. As will be further explained, the alignment bumps 72B are configured to contact alignment surfaces of the alignment opening 50 (FIG. 2A) of the alignment fixture 48 (FIG. 2A), to guide and align the component 30B with respect to the interconnect 36 (FIG. 2A).

Depending on the material, the alignment bumps 72B can be formed using a suitable deposition process. For polymer alignment bumps 72B, screen printing or dispensing a viscous material through a nozzle can be employed. Suitable polymer materials include glob top or dam materials. For metal alignment bumps, screen printing, electro-plating, or electroless deposition can be employed. In addition, depending on the deposition process, metal pads can be formed on the component 30B as nucleation and barrier layers for the alignment bumps 72B. The alignment bumps 72B can be formed of a same solder as the contact bumps 12, or can be formed of a relatively hard metal such as nickel, copper, beryllium copper and alloys of these metals.

The alignment bumps 72B can have a height that is less than a height H (FIG. 1A) of the contact bumps 12 to permit the contact bumps 12 to engage the contact members 38 (FIG. 2A) without interference. Alternately, the alignment bumps 72B can have a height selected to provide a force stop to prevent excessive deformation of the,contact bumps 12 during engagement with the contact bumps 12. In this case, the height of the alignment bumps 72B can be about equal to an average height of the contact bumps 12.

Figure 7:
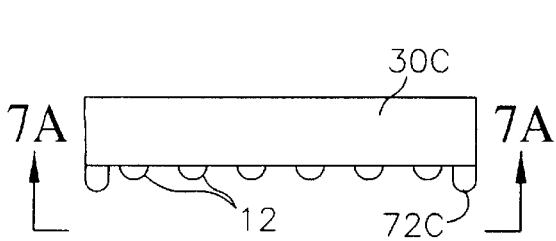
FIG. 7 is a schematic side elevation view of a semiconductor component having alignment members in the form of alignment posts.
Figure 7A:
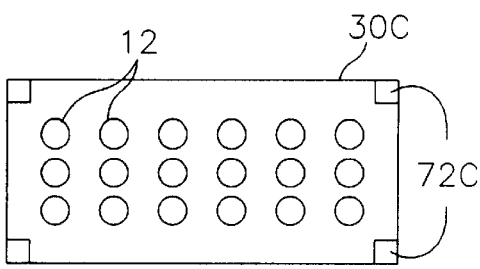
FIG. 7A is a bottom view taken along section line 7A—7A of FIG. 7.

Referring to FIGS. 7 and 7A, another semiconductor component 30C configured for use with the test system 28 (FIG. 2A) is shown. The component 30C comprises a semiconductor die (e.g., 10-FIG. 1A) or a chip scale package (e.g., 14A-FIG. 1B, 14B-FIG. 1C) with contact bumps 12. In addition, the component 30C includes alignment members in the form of alignment posts 72C. The alignment posts 72C comprise pillars of a desired shape having a height greater than the height H (FIG. 1A) of the contact bumps 12. The alignment posts 72C are configured for mating engagement with indentations 74 (FIG. 8C) in an interconnect 36A (FIG. 8C). The alignment posts 72C can be formed of polymers or metals, using suitable deposition processes substantially as previously described for the alignment bumps 72B (FIG. 6). As shown in FIG. 7A, the alignment posts 72C can be located in a desired pattern such as along the corner portions of the face of the component 30C. In the illustrative embodiment, the alignment posts 72C have a generally rectangular shaped cross section with a convex tip portion. Alternately, the alignment posts 72C can be continuously formed along a periphery of the component 30C.

Figure 8A:
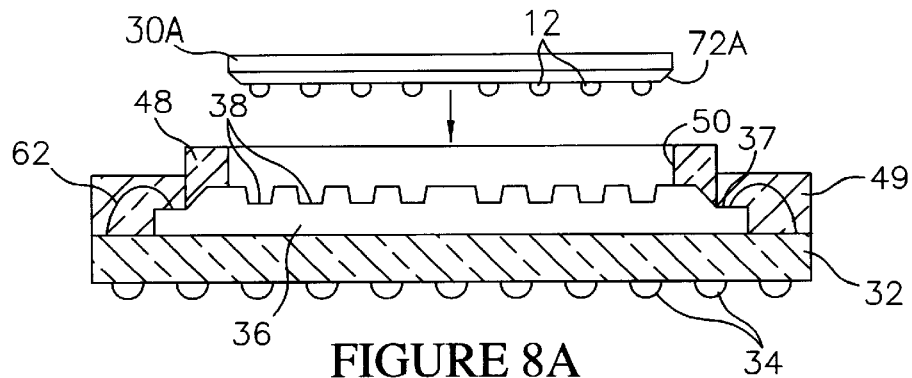
FIG. 8A is a schematic cross sectional view taken along section line 8A—8A of FIG. 2A illustrating an alignment fixture of the system during alignment of a component of FIG. 5.

Referring to FIG. 8A, the construction of the alignment fixture 48 and interaction with the semiconductor component 30A is illustrated. In this embodiment, the alignment fixture 48 comprises a polymer layer deposited on the interconnect 36. One suitable polymer for forming the alignment fixture 48 comprises a negative tone resist, which can be blanket deposited to a desired thickness, exposed with a pattern for the alignment openings 50, developed to form the alignment openings 50 and then cured. Preferably deposition, exposing, developing and curing the polymer is using a wafer level fabrication process. In particular, multiple interconnects 36 can be formed on a single wafer and then singulated following the fabrication process.

A suitable negative tone resist formulation is sold by Shell Chemical under the trademark "EPON RESIN SU-8". Such a resist can be deposited to a thickness of from about 5–50 mils. In addition, the resist can be developed with high aspect ratio features including openings having almost vertical sidewalls. A conventional resist coating apparatus, such as a spin coater, or a meniscus coater, can be used to deposit the resist onto a wafer containing multiple interconnects 36. The deposited resist can then be "prebaked" at about 95° C. for about 15 minutes and exposed in a desired pattern using a conventional UV aligner with a dose of about 165mJ/cm². Developing can be accomplished with a solution of PGMEA (propyleneglycol-monomethylether-acetate). This can be followed by a "full cure" comprising a hard bake at about 200° C. for about 30 minutes.

The above identified "EPON RESIN SU-8" resist formulation can be developed to form the alignment openings 50 with vertical alignment surfaces substantially as shown. In this embodiment the beveled edges 72A of the components 30A can contact the surfaces of the alignment openings 50 to align the component 30A to the interconnect 36.

Still referring to FIG. 8A, the alignment fixture 48 can also include an encapsulant 49 deposited on portions of the interconnect 36 and base 32 to encapsulate and protect the bond wires 62. The encapsulant 49 can comprise a conventional glob top material such as an epoxy, silicone or polyimide. The encapsulant 49 can be formed by dispensing a required volume of viscous material over the bond wires 62. A fence can also be formed on the substrate, as a mold for defining a perimeter of the encapsulant 49. Following dispensing, the encapsulant 49 can be cured at an elevated temperature (e.g. 165° C.) for a suitable period of time (e.g. 60 minutes). The encapsulant 49 can be deposited using a conventional process such as dispensing through a syringe.

Figure 8B:
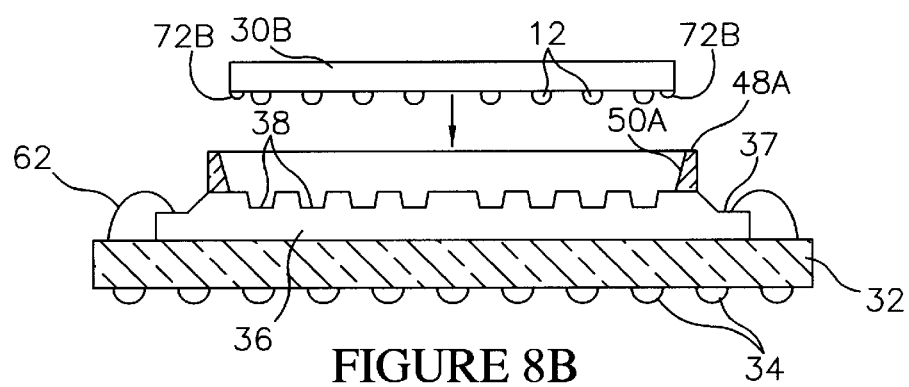
FIG. 8B is a schematic cross sectional view equivalent to FIG. 8A illustrating an alternate embodiment alignment fixture during alignment of the component of FIG. 6.
Figure 8C:
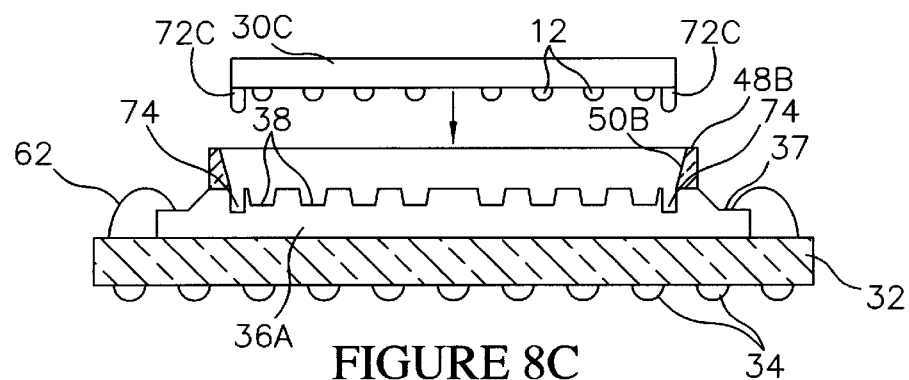
FIG. 8C is a schematic cross sectional view equivalent to FIG. 8A illustrating an alternate embodiment alignment fixture during alignment of the component of FIG. 7.

Referring to FIG. 8B, an alternate embodiment alignment fixture 48A can be formed on the interconnects 36 for aligning components 30B having alignment bumps 72B. In this embodiment, an alignment opening 50A of the alignment fixture 48A includes sloped alignment surfaces. The sloped alignment surfaces of the alignment opening 50A are adapted to contact and guide the alignment bumps 72B. The alignment fixture 48A can comprise a conventional resist formulation deposited and developed as previously described, but with sloped surfaces for the alignment openings 50A. Alternately, the alignment fixture 48A can comprise one or more layers of an adhesive tape, such as "KAPTON" tape by DuPont, or similar tape adapted for bonding lead-on-chip dice to leadframes. With adhesive tape, the tape can be cut and applied in a desired pattern to form alignment openings 50A of a desired size. In addition, the adhesive tape can be etched with beveled edges to form the sloped surfaces of the alignment openings 50A. The alignment fixture 48A can also be a separate piece of molded or machined plastic or other material attached to the interconnect 36 using an adhesive such as silicone.

Referring to FIG. 8C, an alternate embodiment alignment fixture 48B can be formed as a cured resist, as one or more layers of tape, or as a separate member, substantially as previously described. The alignment fixture 48B includes an alignment opening 50B having surfaces configured to contact and guide the alignment posts 72C on component 30C. In this embodiment an interconnect 36A includes indentations 74 for receiving the alignment posts 72C.

Figure 8D:
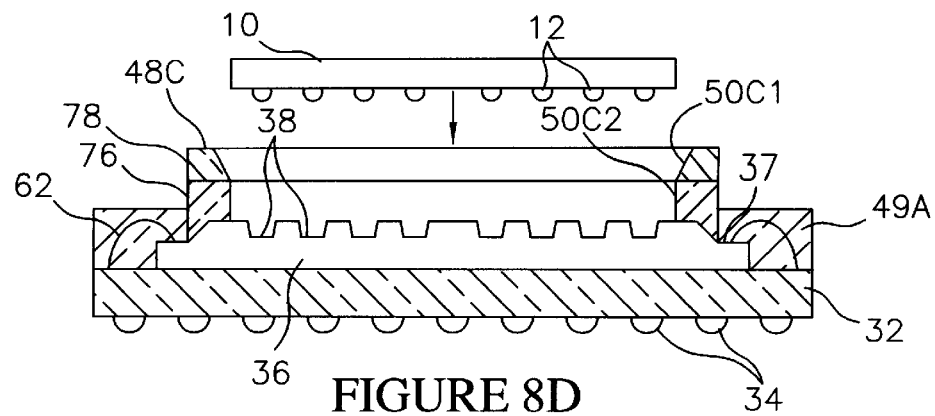
FIG. 8D is a schematic cross sectional view equivalent to FIG. 8A illustrating an alternate embodiment alignment fixture during alignment of the component of FIG. 1A.

Referring to FIG. 8D, an alternate embodiment alignment fixture 48C comprises two separate layers of cured resist. The separate layers are configured to provide staged alignment for the bumped die 10, or other semiconductor component. A first resist layer 76 comprises a conventional resist formulation that can be developed with a first opening 50C1 having sloped surfaces. A second resist layer 78 comprises the above "EPON RESIN SU-8" resist formulation that can be developed with a second opening 50C2 having vertical surfaces. The first opening 50C1 can be sized to guide the edges of the die 10 to provide a gross alignment stage. The second opening 50C2 can be sized to guide the edges of the die 10 to provide a fine alignment stage. This embodiment can also include an encapsulant 49A formed over the bond wires 62, substantially as previously described.

Figure 8E:
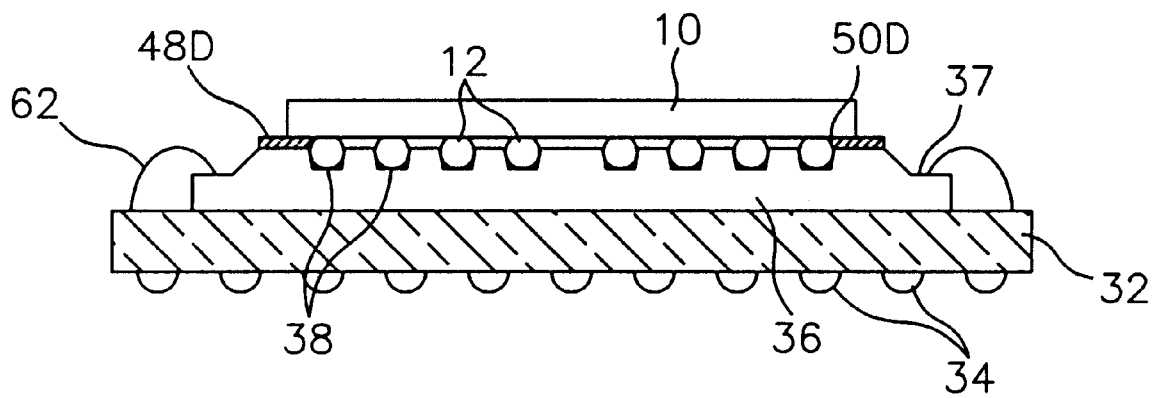
FIG. 8E is a schematic cross sectional view equivalent to FIG. 8A illustrating an alternate embodiment alignment fixture during alignment of the component of FIG. 1A.

Referring to FIG. 8E, an alternate embodiment alignment fixture 48D has an alignment opening 50D with sloped surfaces configured to engage the pattern of contact bumps 12 on the bumped die 10. In this embodiment a thickness of the alignment fixture 48D is preferably less than a height "H" of the contact bumps 12. The alignment fixture 48D can be a cured material, one or more layer of adhesive tape, or a separate member formed substantially as previously described. The cured material can also be formed on the surface of the interconnect 36 between the contact members 38.

Thus the invention provides an improved test system for semiconductor components including dice and chip scale packages. The test system includes a test apparatus having an interconnect for electrically contacting the components, and an alignment fixture with alignment surfaces for aligning the components to the interconnect. In addition the components can include alignment members configured to engage and interact with the alignment surfaces.

While the invention has been described with reference to certain preferred embodiments, as will be apparent to those skilled in the art, certain changes and modifications can be made without departing from the scope of the invention as defined by the following claims.

What is claimed is:

1. A test system for semiconductor components comprising:
   a semiconductor component comprising a plurality of external contacts and a plurality of alignment bumps, each alignment bump having an outside diameter and a height relative to a surface of the component;
   an interconnect comprising a plurality of contact members configured to make non-bonded electrical connections with the external contacts; and
   an alignment fixture on the interconnect comprising a surface configured to engage the alignment bumps to align the component to the interconnect and the external contacts to the contact members.

2. The test system of claim 1 wherein the alignment bumps have a generally hemispherical, convex or dome-shaped.

3. A test system for semiconductor components comprising:
a semiconductor component comprising a plurality of contact bumps and a plurality of alignment bumps, each alignment bump having a diameter and a height;
an interconnect comprising a plurality of indentations at least partially covered with conductive layers configured to retain and electrically contact the contact bumps, the height selected such that the alignment bumps provide a force stop to prevent deformation of the contact bumps into the indentations; and
an alignment fixture on the interconnect comprising an opening having a surface configured to contact the alignment bumps to align the contact bumps to the indentations.

4. The test system of claims 3 wherein the alignment bumps have a generally hemispherical, convex or dome-shaped.

5. The test system of claim 3 wherein the alignment bumps comprise a polymer or a metal.

6. The test system of claim 3 wherein the component comprises an element selected from the group consisting of semiconductor packages and bumped semiconductor dice.

7. A test system for semiconductor components comprising:
a semiconductor component comprising a plurality of contact bumps, each contact bump having a first height, and a plurality of alignment bumps, each alignment bump having a diameter and a second height less than or approximately equal to the first height;
an interconnect comprising a plurality of contact members comprising indentations at least partially covered with conductive layers configured to retain and electrically contact the contact bumps; and
an alignment fixture on the interconnect comprising an opening with a surface configured to contact at least some of the alignment bumps to align the contact bumps to the indentations, with the alignment bumps providing a force stop to prevent deformation of the contact bumps by the contact members.

8. The test system of claim 7 wherein the alignment fixture comprises adhesive tape.

9. The test system of claim 7 wherein the alignment fixture comprises resist.

10. The test system of claim 7 wherein the alignment bumps comprise a material selected from the group consisting of solder, nickel, copper, beryllium copper, and a polymer.

11. A test system for a semiconductor component having a plurality of contact bumps comprising:
at least one alignment bump on the component having a diameter and a height relative to a surface of the component;
an interconnect comprising a plurality of contact members configured to make temporary electrical connections with the contact bumps; and
an alignment fixture on the interconnect comprising an opening configured to contact the alignment bump to align the contact bumps to the contact members.

12. The test system of claim 11 further comprising a plurality of alignment bumps on the component proximate to peripheral edges thereof.

13. The test system of claim 11 wherein the height is selected to provide a force stop and to prevent deformation of the contact bumps by the contact members.

14. A test system for a semiconductor component having a surface with a plurality of contact bumps thereon comprising:
an interconnect comprising a plurality of contact members comprising indentations at least partially covered by conductive layers configured to retain and electrically engage the contact bumps;
a plurality of alignment bumps on the surface of the component, each alignment bumps having a diameter and a height relative to the surface selected to prevent deformation of the contact bumps during electrical engagement by the indentations; and
an alignment fixture on the interconnect comprising an opening configured to contact the alignment bumps to align the contact bumps to the contact members.

15. The test system of claim 14 wherein the alignment bumps are located proximate to peripheral edges of the component.

* * * * *